(12) United States Patent
Zhou et al.

(10) Patent No.: US 11,024,210 B2
(45) Date of Patent: Jun. 1, 2021

(54) DISPLAY PANEL AND DISPLAY DEVICE WITH NOTCH EDGE

(71) Applicant: XIAMEN TIANMA MICRO-ELECTRONICS CO., LTD., Xiamen (CN)

(72) Inventors: Xiufeng Zhou, Xiamen (CN); Huangyao Wu, Xiamen (CN); Hongbo Zhou, Xiamen (CN); Zhijie Wang, Xiamen (CN); Jian Liu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/451,629

(22) Filed: Jun. 25, 2019

(65) Prior Publication Data
US 2020/0202760 A1  Jun. 25, 2020

(30) Foreign Application Priority Data
Dec. 25, 2018 (CN) .......................... 201811589150.5

(51) Int. Cl.
*G09G 3/20* (2006.01)
*G11C 19/28* (2006.01)

(52) U.S. Cl.
CPC ............. *G09G 3/20* (2013.01); *G11C 19/287* (2013.01); *G09G 2300/0426* (2013.01); *G09G 2310/027* (2013.01); *G09G 2310/0286* (2013.01)

(58) Field of Classification Search
CPC ...................................................... G09G 3/20
USPC ............................................................ 345/55
See application file for complete search history.

(56) References Cited

U.S. PATENT DOCUMENTS

| 2019/0005915 A1* | 1/2019 | Liu | G02F 1/13454 |
| 2019/0109184 A1* | 4/2019 | Li | H01L 27/3248 |
| 2020/0105201 A1* | 4/2020 | Li | G09G 3/3266 |
| 2020/0111988 A1* | 4/2020 | Lee | H01L 51/5237 |

FOREIGN PATENT DOCUMENTS

CN 107342036 A 11/2017

* cited by examiner

*Primary Examiner* — Long D Pham
(74) *Attorney, Agent, or Firm* — Anova Law Group PLLC

(57) ABSTRACT

Display panel and display device are provided. An exemplary display panel includes a display area and a non-display area surrounding the display area. The display area includes a plurality of gate lines, a plurality of data lines, and an irregularly-shaped edge. The non-display area includes a first non-display area adjacent to the irregularly-shaped edge. The first non-display area includes a first sub-area adjacent to the sub-edge. The plurality of data lines includes a plurality of irregularly-shaped data lines. The plurality of irregularly-shaped data lines includes a plurality of winding portions in the first sub-area which includes at least one first winding portion, and the at least one first winding portion has at least a wiring portion in a film layer different than a remaining portion of the plurality of winding portions.

20 Claims, 11 Drawing Sheets

DISPLAY PANEL AND DISPLAY DEVICE WITH NOTCH EDGE

CROSS-REFERENCES TO RELATED APPLICATIONS

This application claims the priority of Chinese Patent Application No. CN201811589150.5, filed on Dec. 25, 2018, the entire contents of all of which are incorporated herein by reference.

FIELD OF THE DISCLOSURE

The present disclosure generally relates to the field of display technologies and, in particular, relates to a display panel and a display device.

BACKGROUND

With the development of electronic technology, display panel manufacturing has become more matured. Display panels often include a liquid crystal display panel, an organic light emitting display panel, a plasma display panel, and the like. In order to increase the display screen and the aesthetic appearance of a display device, increasing the screen ratio of the display device has gradually become a development trend. Conventional display devices, such as screens for displays, televisions, cell phones, tablets, etc., are typically shaped as regular rectangles.

However, demands for display device screens have become more and more diverse, and simple rectangular display devices have been unable to meet the user's needs. Therefore, display devices of various shapes have emerged. Some display panels are designed having a shape other than a regular rectangle. Such display panel is generally referred to as a irregularly-shaped display panel, and the irregularly-shaped display panel can allow the screen shape of the display device diversified.

In addition, based on the structural design of a full screen, it is necessary to provide a slot in the irregularly-shaped display panel to mount a camera, an earpiece, a sensor and the like. However, the irregularly-shaped display panel with the slot has a wider border at the slot, which reduces the screen ratio, and is not conducive to realizing the display effect of a full screen.

Therefore, there is a need to solve technical problems in the art to provide a display panel and a display device with reduced border width of the irregularly-shaped display panel at the slot and increased screen ratio.

BRIEF SUMMARY OF THE DISCLOSURE

One aspect of the present disclosure includes a display panel including a display area and a non-display area surrounding the display area. The display area includes a plurality of gate lines, a plurality of data lines, and an irregularly-shaped edge. The plurality of gate lines extends in a row direction and the plurality of data lines extends in a column direction. The irregularly-shaped edge includes at least one sub-edge, the at least one sub-edge is recessed toward an inside of the display area to form a notch, and a remaining portion of the irregularly-shaped edge other than the at least one sub-edge extends in the column direction. The non-display area includes a first non-display area adjacent to the irregularly-shaped edge. The first non-display area includes a gate driving circuit electrically connected to the plurality of gate lines. The first non-display area includes a first sub-area adjacent to the at least one sub-edge. The plurality of data lines includes a plurality of irregularly-shaped data lines extending through the first sub-area, and the plurality of irregularly-shaped data lines includes a plurality of winding portions in the first sub-area which is located at a side of the gate driving circuit away from the display area. The plurality of winding portions includes at least one first winding portion, and the at least one first winding portion has at least a wiring portion in a film layer different than a remaining portion of the plurality of winding portions.

Another aspect of the present disclosure includes a display device including the display panel provided by the present disclosure. The display panel includes a display area and a non-display area surrounding the display area. The display area includes a plurality of gate lines, a plurality of data lines, and an irregularly-shaped edge. The plurality of gate lines extends in a row direction and the plurality of data lines extends in a column direction. The irregularly-shaped edge includes at least one sub-edge, the at least one sub-edge is recessed toward an inside of the display area to form a notch, and a remaining portion of the irregularly-shaped edge other than the at least one sub-edge extends in the column direction. The non-display area includes a first non-display area adjacent to the irregularly-shaped edge. The first non-display area includes a gate driving circuit electrically connected to the plurality of gate lines. The first non-display area includes a first sub-area adjacent to the at least one sub-edge. The plurality of data lines includes a plurality of irregularly-shaped data lines extending through the first sub-area, and the plurality of irregularly-shaped data lines includes a plurality of winding portions in the first sub-area which is located at a side of the gate driving circuit away from the display area. The plurality of winding portions includes at least one first winding portion, and the at least one first winding portion has at least a wiring portion in a film layer different than a remaining portion of the plurality of winding portions.

Other aspects of the present disclosure can be understood by those skilled in the art in light of the description, the claims, and the drawings of the present disclosure. Further features of the present disclosure and its advantages will become apparent from the following detailed description of exemplary embodiments.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
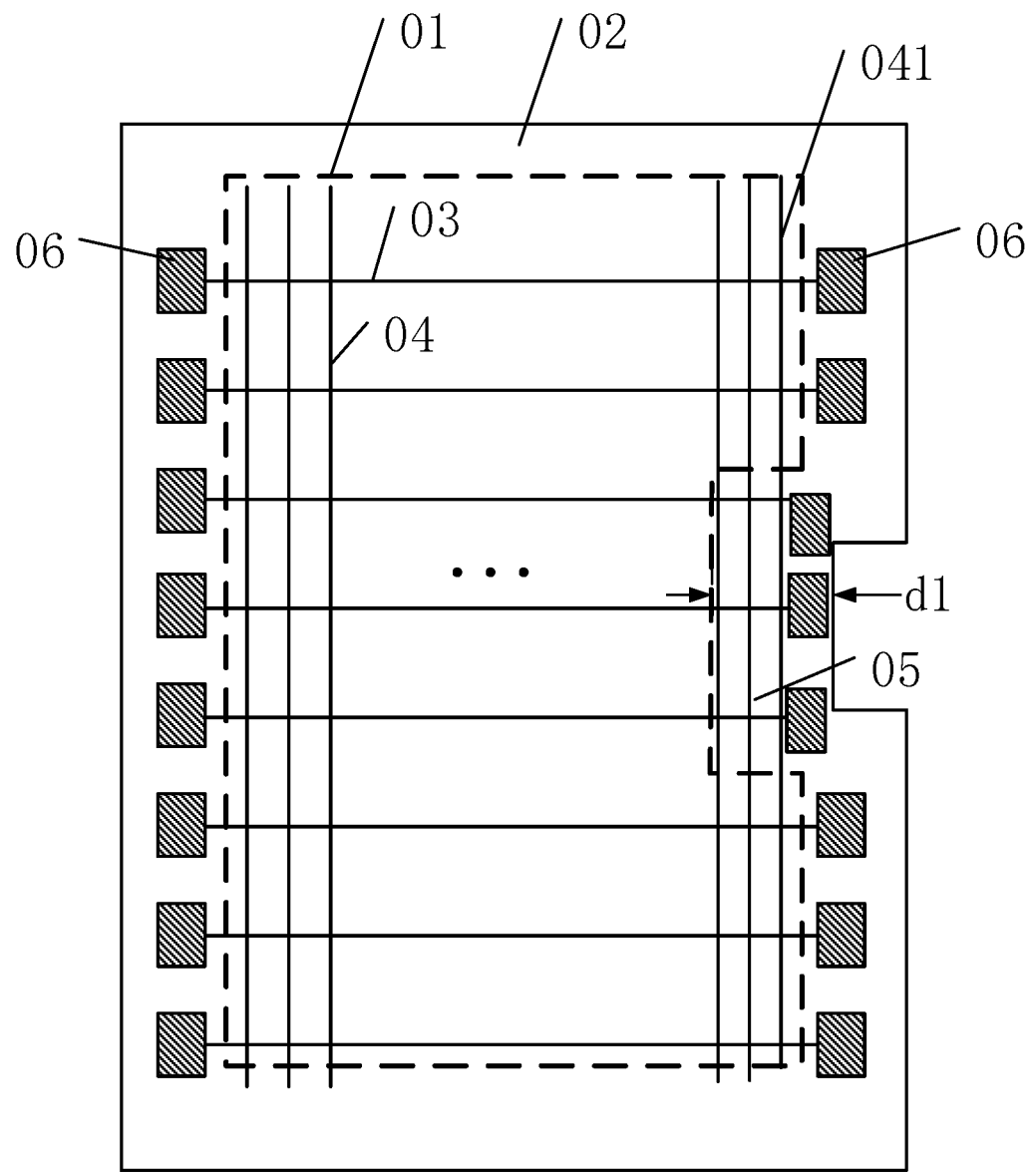
FIG. 1 is a schematic top view of a display panel.

Various exemplary embodiments of the present disclosure are described in detail with reference to the drawings. It should be noted that the relative arrangement of the components and steps, numerical expressions, and numerical values set forth in the exemplary embodiments are not intended to limit the scope of the present disclosure unless otherwise specified.

The following description of at least one exemplary embodiment is merely illustrative, and never in any way limits the present disclosure and its application or use.

Techniques, methods, and apparatus known to those skilled in the art may not be discussed in detail, but the techniques, the methods, and the apparatus should be considered as part of the present disclosure, where appropriate.

In all of the examples shown and discussed herein, any specific values are to be construed as illustrative only and not as a limitation. Thus, other examples of the exemplary embodiments may have different values.

It should be noted that similar reference numerals and letters indicate similar items in the following drawings, and therefore, once an item is defined in one drawing, it is not required to be further discussed in the subsequent drawings.

FIG. 1 is a schematic top view of a display panel. The display panel shown in FIG. 1 includes a display area 01 and a non-display area 02, and the display area 01 is provided with a slot 05. The display area 01 includes a plurality of gate lines 03 and a plurality of data lines 04, the plurality of gate lines 03 is located in a first metal layer, and the plurality of data lines 04 is located in a second metal layer. The non-display area 02 includes a driving circuit including a plurality of shift registers 06.

At least one of the plurality of data lines 04 is an irregularly-shaped data line 041, the irregularly-shaped data line 041 extends through the slot 05, some of the plurality of shift registers 06 are disposed in the slot 05, and a width d1 of the slot 05 is large. That is, the width of the border at the position of the slot 05 is large, which is disadvantageous for narrowing the border of the display panel.

In order to solve the above technical problems, the present disclosure provides a display panel and a display device. Exemplary embodiments of a display panel and a display device provided by the present disclosure will be described in detail below.

Figure 2:
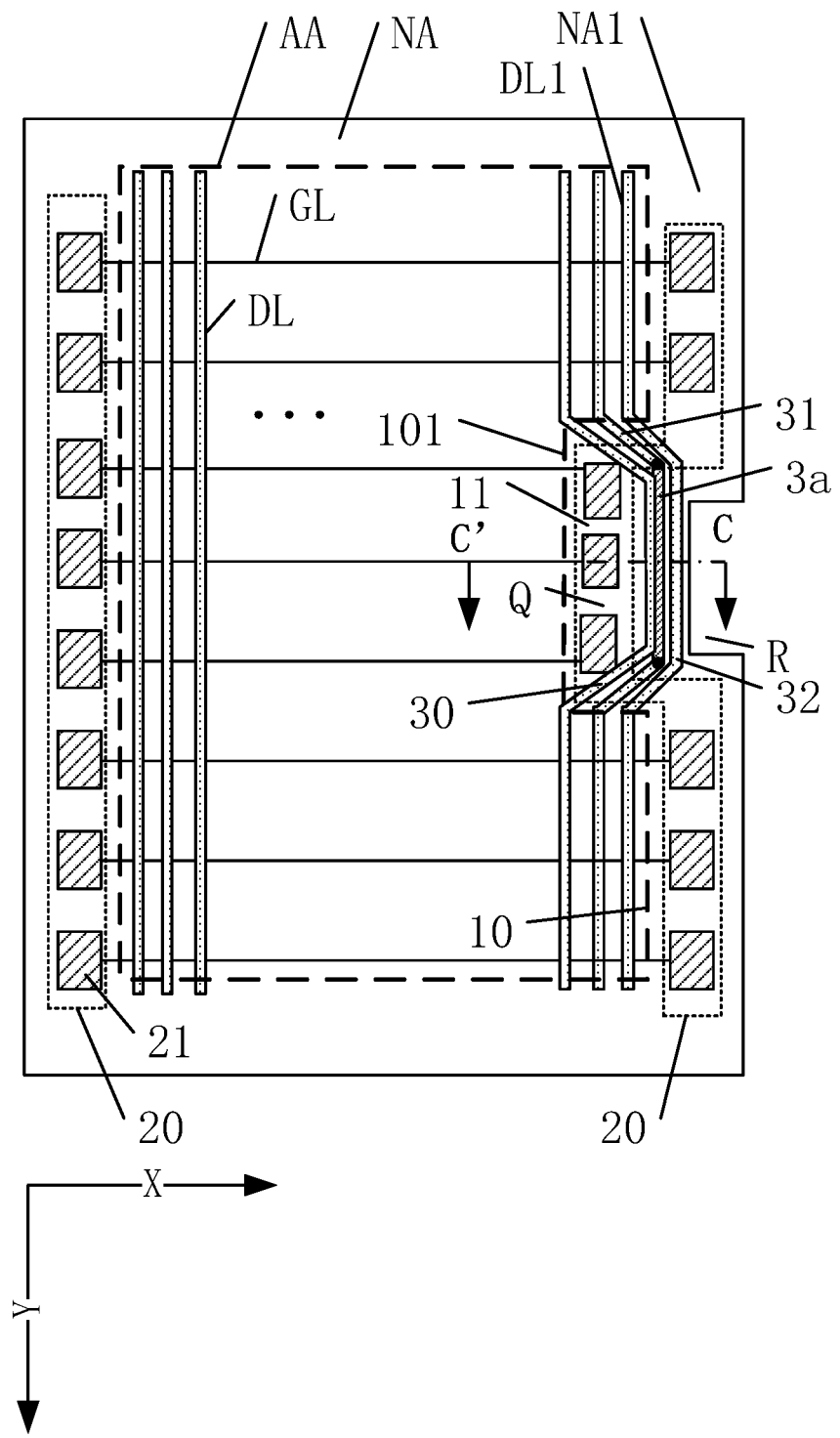
FIG. 2 is a schematic top view of an exemplary display panel according to an embodiment of the present disclosure.
Figure 3:
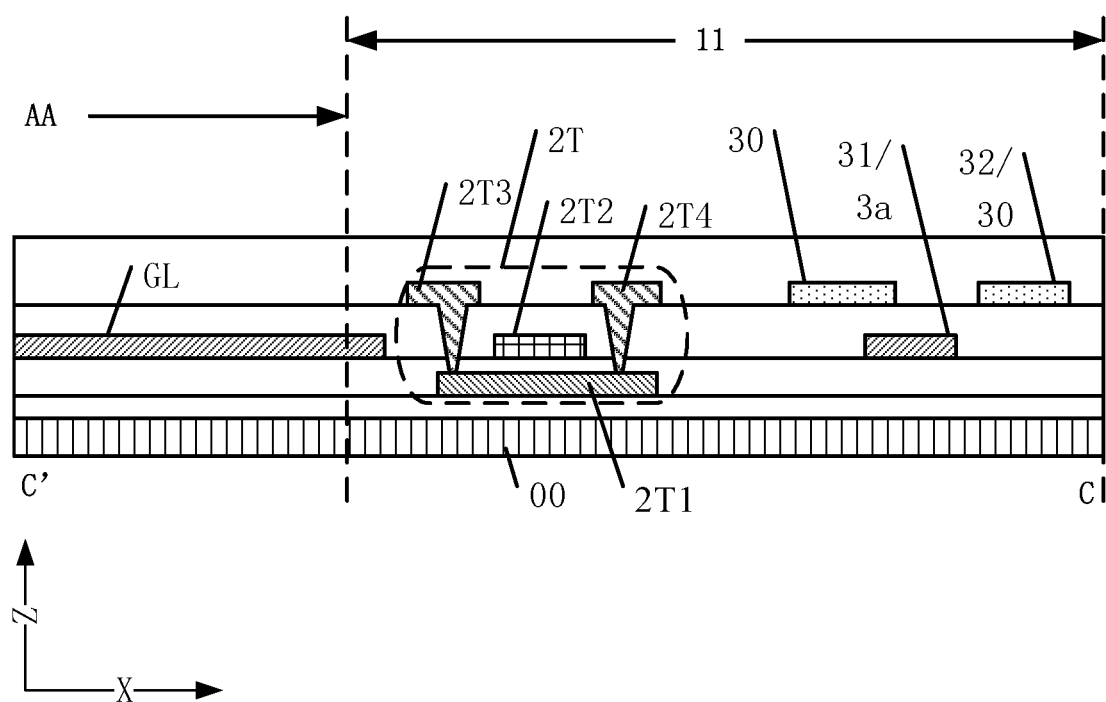
FIG. 3 is a cross-sectional structural view taken along line CC' of FIG. 2.

Referring to FIG. 2 and FIG. 3, FIG. 2 is a schematic top view of an exemplary display panel according to an embodiment of the present disclosure and FIG. 3 is a cross-sectional structural view taken along line CC' of FIG. 2. One embodiment provides a display panel, including:

a display area AA and a non-display area NA surrounding the display area AA;

the display area AA includes a plurality of gate lines GL, a plurality of data lines DL, and an irregularly-shaped edge 10; the plurality of gate lines GL extends in a row direction X, the plurality of data lines DL extends in a column direction Y; and the irregularly-shaped edge 10 includes at least one sub-edge 101, the at least one sub-edge 101 is recessed toward an inside of the display area AA to form a notch Q, and a remaining portion of the irregularly-shaped edge 10 other than the at least one sub-edge 101 extends in the column direction Y;

the non-display area NA includes a first non-display area NA1 adjacent to the irregularly-shaped edge 10; the first non-display area NA1 includes a gate driving circuit 20 electrically connected to the plurality of gate lines GL;

the first non-display area NA1 includes a first sub-area 11 adjacent to the at least one sub-edge 101;

the plurality of data lines DL includes a plurality of irregularly-shaped data lines DL1 extending through the first sub-area 11, and the plurality of irregularly-shaped data line DL1 includes a plurality of winding portions 30 in the first sub-area which is located at a side of the gate driving circuit 20 away from the display area AA; and the plurality of winding portions 30 includes at least one first winding portion 31, and the first winding portion 31 has at least a wiring portion in a film layer different than a remaining portion of the plurality of winding portions 30.

In the display panel provided by one embodiment, the display area AA includes the irregularly-shaped edge 10, and although the irregularly-shaped edge 10 is not a straight segment shape, including the at least one sub-edge 101 that is recessed toward an inside of the display area AA, a remaining portion of the irregularly-shaped edge 10 except the at least one sub-edge 101 may be a straight segment shape and extends in the column direction Y. Also, since the at least one sub-edge 101 is short, the effect on the overall extension direction of the irregularly-shaped edge 10 is small. Therefore, the general extending direction of the irregularly-shaped edge 10 and the extending direction of the plurality of data lines DL are substantially the same, and it can be considered that both extend in the column direction Y.

In one embodiment, the display area AA of the display panel is irregularly-shaped, and the display area AA has the notch Q. Correspondingly, the display panel forms a slot R at the position of the notch Q. When the display panel provided in this embodiment is applied to a display device, the notch Q and the slot R can reserve space for an electronic component such as a camera, which is beneficial to realize technical effect of a full screen.

The non-display area NA includes the first non-display area NA1, and the first non-display area NA1 and the display area AA are divided by the irregularly-shaped edge 10. The first non-display area NA1 includes the first sub-area 11, and the first sub-area 11 and the display area AA are divided by the at least one sub-edge 101.

Since the display area. AA has the notch Q, there are a plurality of data lines that need to be routed through the first sub-area 11, which is the plurality of irregularly-shaped data lines DL1. The plurality of irregularly-shaped data lines DL1 includes the plurality of winding portions 30 in the first sub-area 11, and the first sub-area 11 includes the plurality of winding portions 30.

In one embodiment, in order to reduce the width of the first sub-area 11 in the row direction X, the at least one first winding portion 31 is set in the plurality of winding portions 30, and the at least a wiring portion of the at least one first winding portion 31 is in a film layer different than the remaining of the plurality of winding portions. That is, the at least a wiring portion of the at least one first winding portion 31 is changed to other film layers of the display panel, or the entire wiring of the at least one first winding portion 31 is changed to other film layers of the display panel (i.e., all wiring of the at least one first winding portion 31 is in a film layer different than the remaining of the plurality of winding portions 30), so that the at least a wiring portion of the at least one first winding portion 31 and adjacent winding portions 30 may overlap in the direction perpendicular to the display panel, thereby reducing the spacing in the row direction X between the at least one first winding portion 31 and adjacent winding portions 30. The space occupied by the plurality of winding portions 30 in the row direction X can be reduced, and thus the width of the first sub-area 11 in the row direction X can be reduced.

It should be noted that in the display panel shown in FIG. 2 and FIG. 3, a wiring portion of the at least one first winding portion 31 is in a film layer different than the remaining of the plurality of winding portions 30. For example, a wiring portion 3a of the at least one first winding portion 31 is in a film layer different than the remaining of the plurality of winding portions 30.

Figure 4:
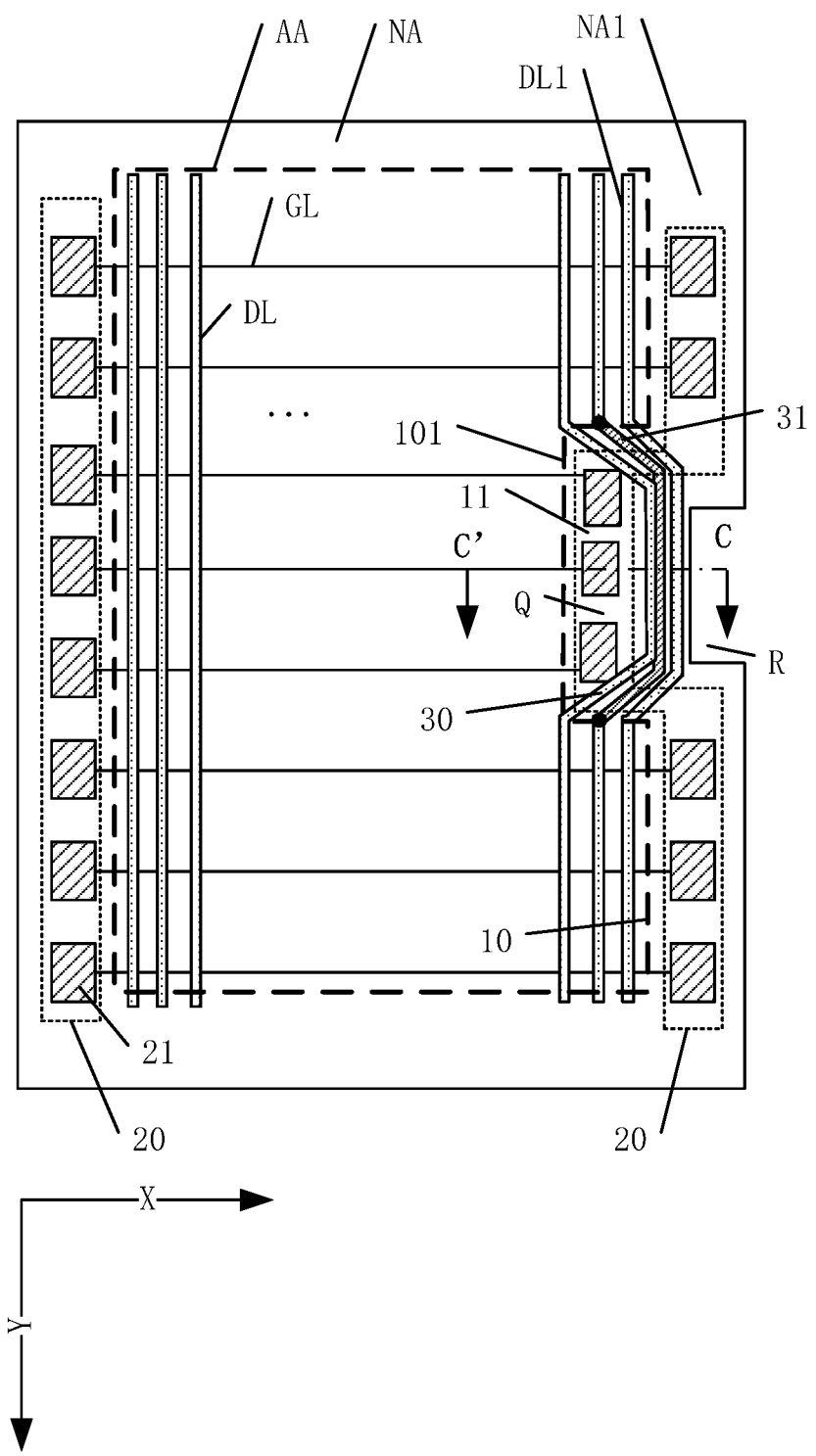
FIG. 4 is a schematic top view of another exemplary display panel according to an embodiment of the present disclosure.

In other embodiments of the present disclosure, all wiring of the at least one first winding portion (i.e., the entire wiring of the at least one first winding portion) is in a film layer different than the remaining of the plurality of winding portions. For example, referring to FIG. 4, FIG. 4 is a schematic top view of another display panel according to an embodiment of the present disclosure. The display panel shown in FIG. 4 is different from FIG. 2 in that the entire wiring of the at least one first winding portion 31 is in a film layer different than the remaining of the plurality of winding portions 30. In FIGS. 2 and 4, the film structure of the plurality of winding portions 30 is distinguished by a filling pattern, and the filling pattern is different, then the film layer structure is different.

In the display panel, a portion of the plurality of gate lines GL in the display area AA is located in a first metal layer, and a portion of the plurality of data lines DL in the display area AA is located in a second metal layer. Since the gate driving circuit 20 is provided in the first non-display area NA1, the gate driving circuit 20 supplies a driving signal to the plurality of gate lines GL, and thus the plurality of gate lines GL needs to be electrically connected to the gate driving circuit 20. The first sub-area 11 is provided with the gate driving circuit and the plurality of winding portions 30. In order to avoid short-circuiting between a wiring portion of the at least one first winding portion 31 and the plurality of gate lines GL, the plurality of winding portions 30 is disposed on the side of the gate driving circuit 20 away from the display area AA in one embodiment.

It should be noted that the gate driving circuit 20 is disposed in the first non-display area NA1. Optionally, the gate driving circuit 20 includes a plurality of cascaded shift registers 21. The cascading relationship of the plurality of cascaded shift registers 21 is not specifically limited according to various embodiments of the present disclosure. The plurality of cascaded shift registers 21 may include a plurality of transistor switches, and may further include components such as capacitors and/or resistors. The specific circuit structure of the plurality of cascaded shift registers 21 is not specifically limited according to various embodiments of the present disclosure. In FIG. 3, only one transistor switch 2T in the plurality of cascaded shift registers 21 is illustrated to exemplarily describe the film structure of the display panel, and the transistor switch 2T includes a semiconductor region 211, a gate 2T2, a source 2T3, and a drain 214. Optionally, the display panel includes a substrate 00, and structures such as the plurality of gate lines GL, the plurality of data lines DL, and the transistor switch 2T are all disposed on the substrate 00.

In the display panel provided in one embodiment, the display area AA has the notch Q, and the plurality of irregularly-shaped data lines DL1 needs to be routed through the first sub-area 11, and the plurality of irregularly-shaped data lines DL1 includes the plurality of winding potions 30 in the first sub-area 11. The plurality of winding portions 30 includes the at least one first winding portion 31, and a wiring portion of the at least one first winding portion 31 is in a film layer different than the remaining of the plurality of winding portions 30, thereby reducing the space in the row direction X between the at least one winding portion 31 and the adjacent winding portions 30. The width of the first sub-area 11 in the row direction X can be unconventionally reduced. Also, in order to further prevent the at least one first winding portion 31 and the plurality of gate lines GL from being short-circuited in the first sub-area 11, the plurality of winding portions 30 is disposed on the side of the gate driving circuit 20 away from the display area AA.

In other alternative embodiments, with continued reference to FIGS. 2 and 3, the plurality of winding portions 30 includes at least one second winding portion 32, and the remaining portion of the plurality of winding portions is in a same film layer and includes the at least one second winding portion 32. Optionally, except the at least one first winding portions 31, the remaining of the plurality of winding portions are second winding portions 32.

In the display panel provided by one embodiment, the plurality of irregularly-shaped data lines DL1 located in the second winding portions 32 need not be changed, and may be disposed in a same metal layer. The plurality of data lines is disposed in the second metal layer of the display panel. In one embodiment, the plurality of irregularly-shaped data lines DL1 in the second winding portions 32 may be disposed in the second metal layer, and only a wiring portion of the at least one first winding portion 31 is changed, so that the wiring portion of the at least one first winding portion 31 is placed in other layers of the display panel.

Figure 5:
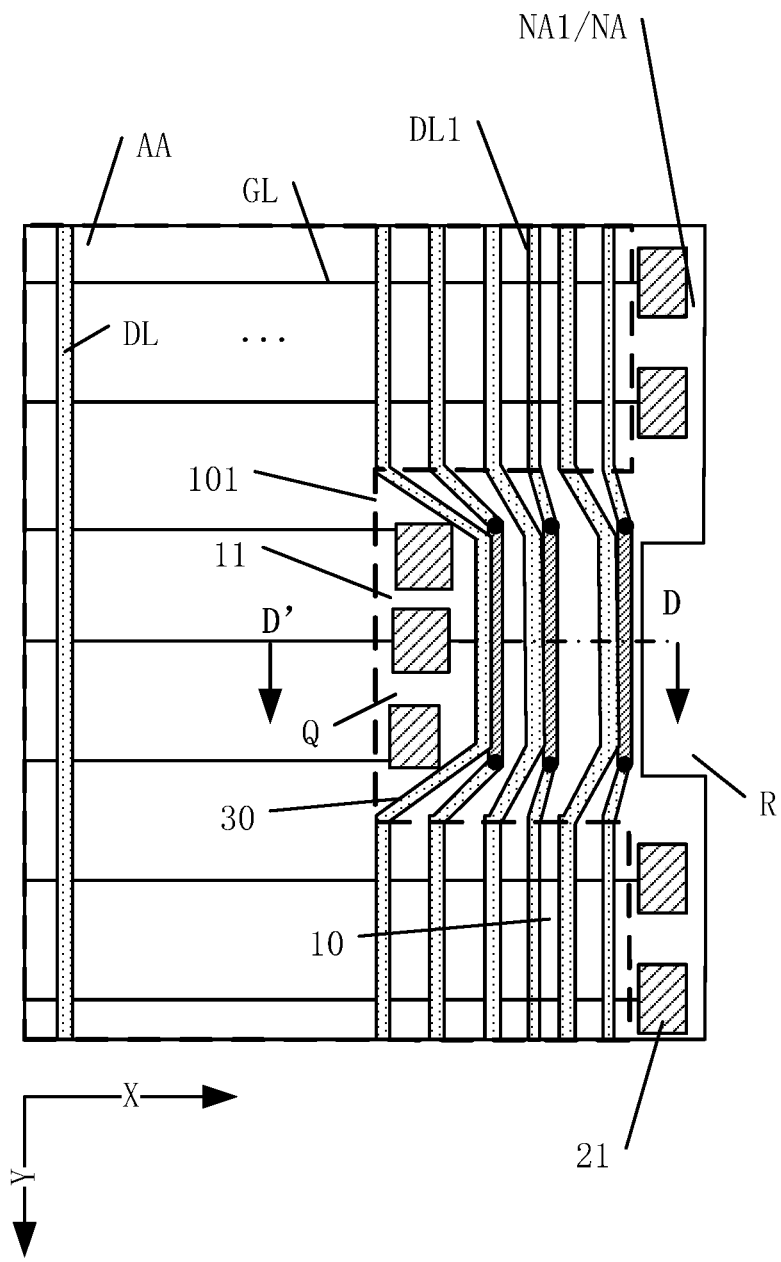
FIG. 5 is a partial schematic top view of another exemplary display panel according to an embodiment of the present disclosure.
Figure 6:
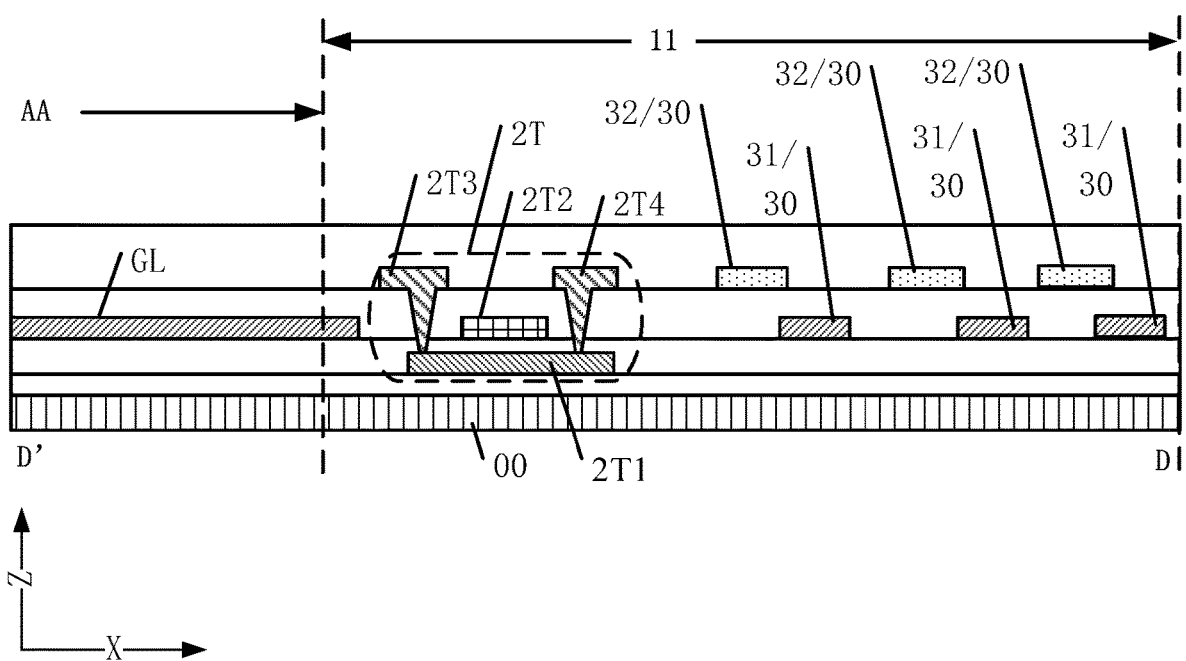
FIG. 6 is a cross-sectional structural view taken along line DD' in FIG. 5.

In some optional embodiments, referring to FIG. 5 and FIG. 6, FIG. 5 is a partial schematic top view of another display panel according to an embodiment of the present disclosure and FIG. 6 is a cross-sectional structural view taken along line DD' in FIG. 5. In one embodiment, the plurality of winding portions 30 includes a plurality of first winding portions 31 and a plurality of second winding portions 32, and the plurality of first winding portions 31 and the plurality of second winding portions 32 are alternately arranged in the row direction X.

In one embodiment, it is only illustrated with three of the plurality of first winding portions 31, and three of the plurality of second winding portions 32. It can be understood that the specific numbers of the plurality of first winding portions 31 and the plurality of second winding portions 32 can be set according to the actual design requirements of the display panel, which is not specifically limited according to various embodiments of the present disclosure.

In the display panel provided in one embodiment, the plurality of first winding portions 31 and the plurality of second winding portions 32 are alternately arranged in the row direction X. Thus, for any two adjacent irregularly-shaped data lines DL1, winding portions are a first winding portion 31 and a second winding portion 32, respectively, which can overlap in the direction Z perpendicular to the display panel. The display panel provided by this embodiment can further reduce the space occupied by the plurality of winding portions along the row direction X, thereby further reducing the width of the first sub-area 11, facilitating narrowing the border of the display panel, and facilitating the realization of the technical effect of a full screen.

Figure 7:
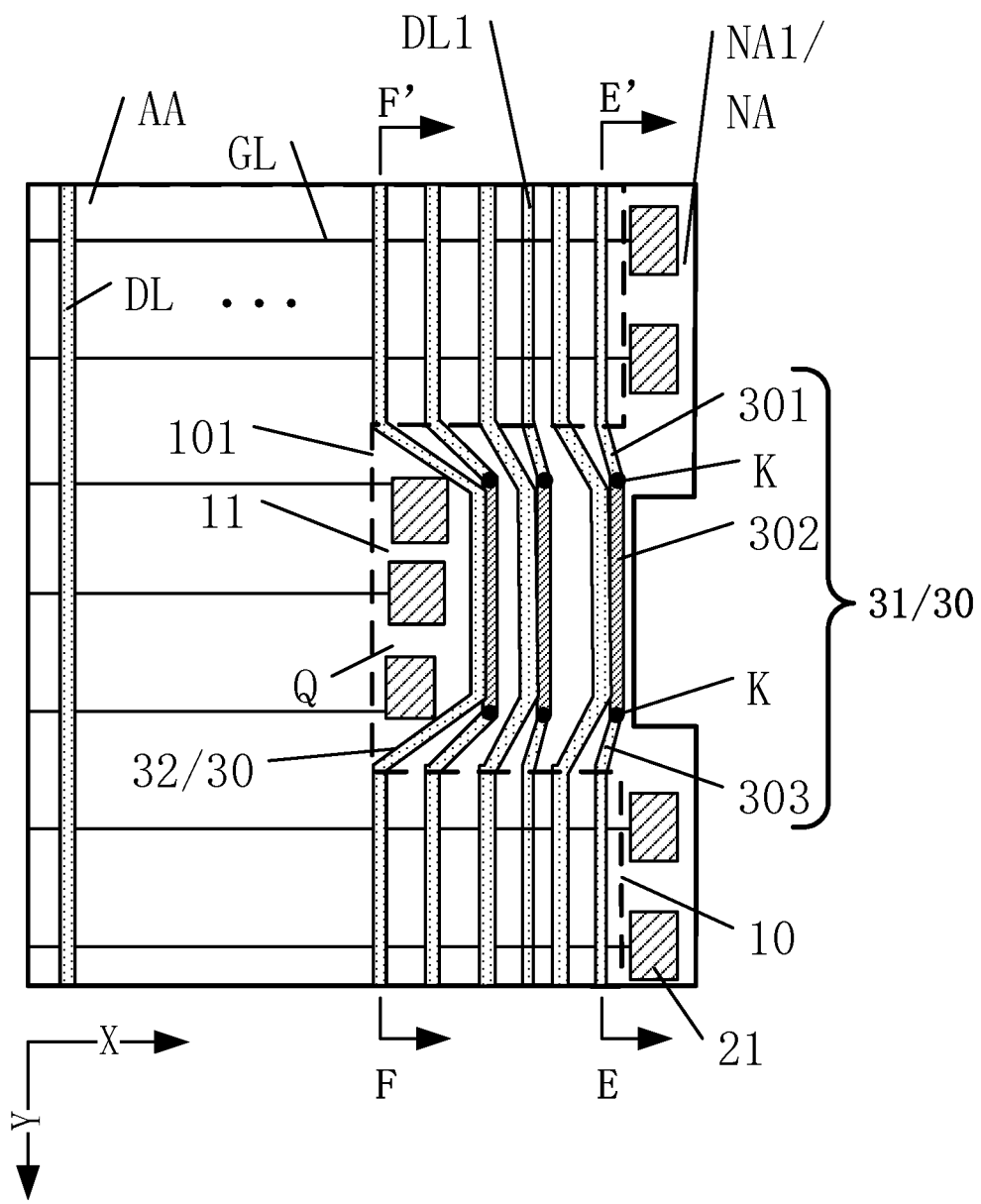
FIG. 7 is a partial schematic top view of another exemplary display panel according to an embodiment of the present disclosure.

In some alternative embodiments, referring to FIG. 7, FIG. 7 is a partial schematic top view of another display panel according to an embodiment of the present disclosure. In this embodiment, each of the plurality of winding portions 30 includes a first sub-portion 301, a second sub-portion 302, and a third sub-portion 303. One end of the second sub-portion 302 is connected to the first sub-portion 301, and an other end of the second sub-portion 302 is connected to the third subsection 303.

In the at least one first winding portion 31, the first sub-portion 301 and the third sub-portion 303 are located in a same film layer, and the second sub-portion 302 and the first sub-portion 301 are located in different film layers.

Optionally, in the at least one first winding portion 31, one end of the second sub-portion 302 is connected to the first sub-portion 301 through a via K, and the other end of the second sub-portion 302 is connected the third sub-portion 303 through another via K.

In one embodiment, each of the plurality of winding portions 30 in the first sub-area 11 is divided into three segments, which are the first sub-portion 301, the second sub-portion 302, and the third sub-portion 303, respectively. Optionally, the second sub-portion 302 extends in the column direction Y, and the extending directions of the first sub-portion 301 and the third sub-portion 303 intersect. In the at least one first winding portion 31, only the second sub-portion 302 is changed to reduce the difference in resistance between the at least one first winding portion 31 and the second winding portions 32 due to material difference and film structure difference. Thereby, the load difference between the plurality of irregularly-shaped data lines DL1 is reduced.

Figure 8:
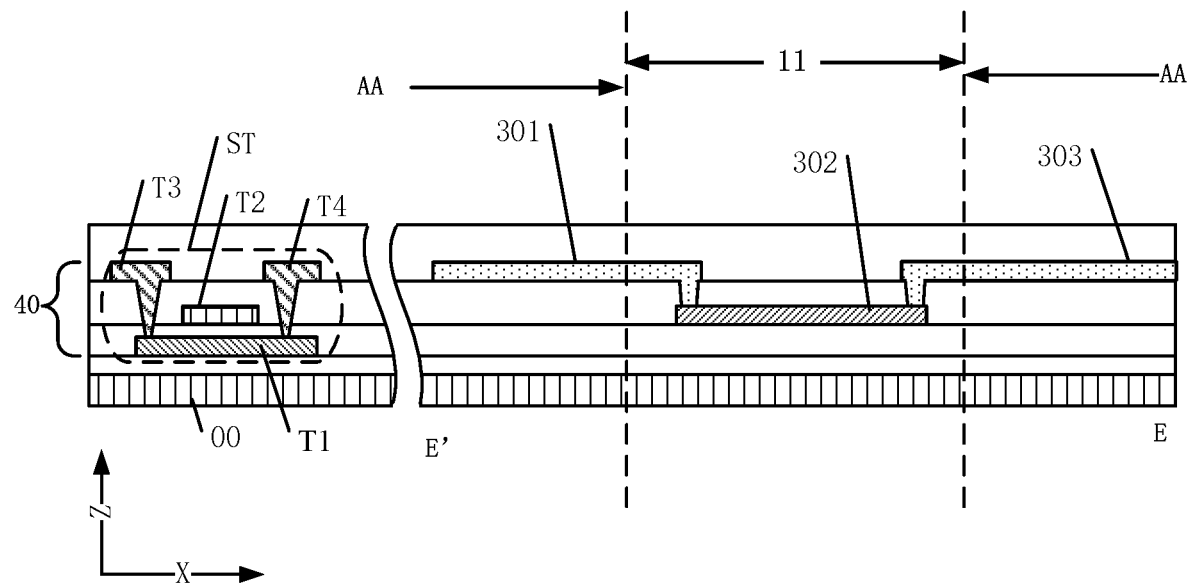
FIG. 8 is a cross-sectional structural view taken along line EE' in FIG. 7.

In some alternative embodiments, referring to FIG. 7 and FIG. 8, FIG. 8 is a cross-sectional structural view taken along line EE' in FIG. 7. In one embodiment, the display panel includes a driving device layer 40, the driving device layer 40 includes a plurality of thin film transistors ST, and each of the plurality of thin film transistors ST includes a semiconductor region T1, a gate 12, a source T3, and a drain T4.

The first sub-portion 301, the third sub-portion 303, the source T3 and the drain T4 are located in a same film layer.

The second sub-portion 302 and the gate T2 are located in a same film layer.

It is to be noted that, in order to clearly illustrate the technical solution of the present embodiment, FIG. 8 is the cross-sectional structure view along taken the line EE' in FIG. 7 and also illustrates the cross-sectional structure view of the display panel at a thin film transistor ST.

In one embodiment, the second sub-portion 302 and the gate T2 are located in a first metal layer, and the first sub-portion 301, the third sub-portion 303, the source T3 and the drain T4 are located in a second metal layer. In the at least one first winding portion 31, the film layer in which the gate T2 is located is multiplexed to dispose the second sub-portion 302. Therefore the second sub-portion 302 can be disposed without adding an additional conductive layer, thereby reducing the film structures of the display panel. It is advantageous to thin the display panel, simplifies the manufacturing process of the display panel, and reduces the cost.

Figure 9:
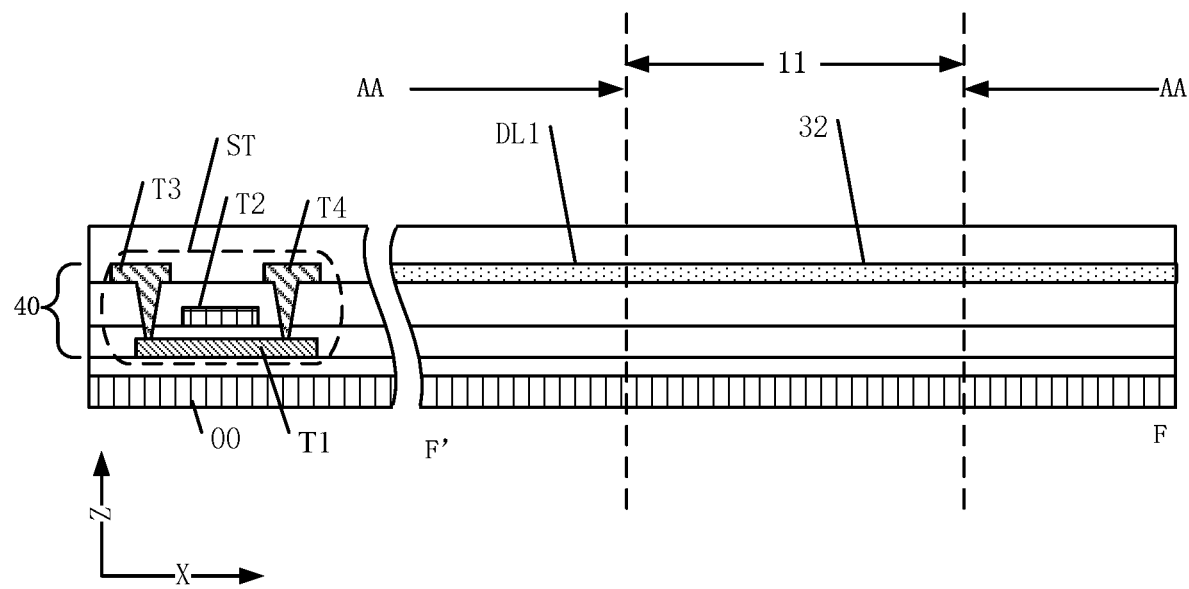
FIG. 9 is a cross-sectional structural view taken along line FF' of FIG. 7.

In some alternative embodiments, referring to FIG. 7 and FIG. 9, FIG. 9 is a schematic cross-sectional view taken along line FF' of FIG. 7. In one embodiment, the display panel includes a driving device layer 40, the driving device layer 40 includes a plurality of thin film transistors ST, and each of the plurality of thin film transistors ST includes a semiconductor region T1, a gate T2, a source T3 and a drain 14.

The second winding portions 32, the source T3, and the drain T4 are located in a same film layer.

It is to be noted that, in order to clearly illustrate the technical solution of the present embodiment, FIG. 9 is the cross-sectional structure view taken along the line FF' in FIG. 7 and illustrates the cross-sectional structure view of the display panel at a thin film transistor ST.

In one embodiment, the second winding portions 32 does not need to change lines, and are disposed on a second metal layer. Optionally, the plurality of irregularly-shaped data lines DL1 in the second winding portions 32 are all disposed on the second metal layer.

Figure 10:
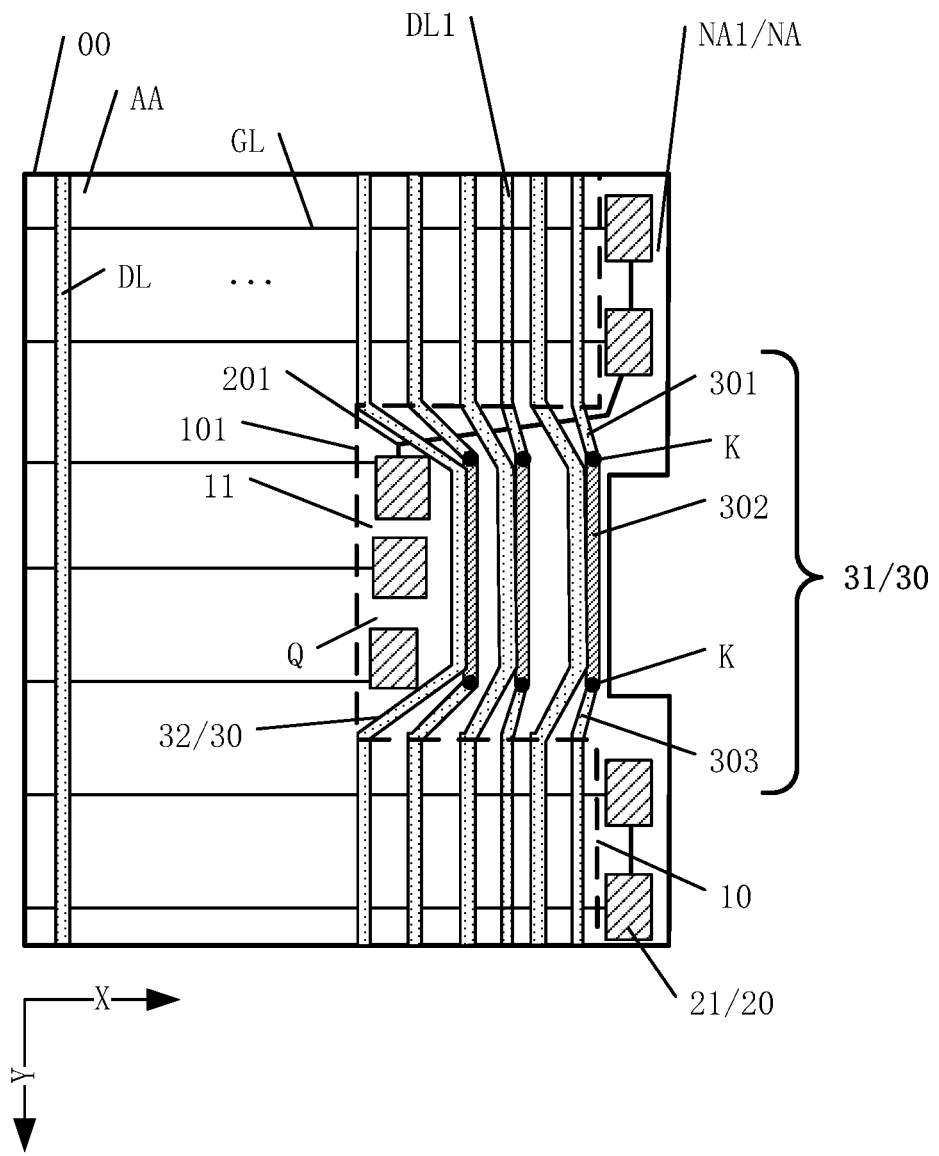
FIG. 10 is a partial schematic top view of another exemplary display panel according to an embodiment of the present disclosure.

In some alternative embodiments, referring to FIG. 10, FIG. 10 is a partial schematic top view of another display panel according to an embodiment of the present disclosure. In one embodiment, the gate driving circuit 20 includes signal lines 201.

The display panel includes a substrate 00, an orthogonal projection of at least one of the signal lines 201 on the substrate 00 intersects with an orthographic projection of one of the first sub-portion 301 and the third sub-portion 303 on the substrate 00.

The signal lines 201 and the first sub-portion 301 are respectively located in different film layers.

In one embodiment, at least one of the signal lines 201 is disposed in the gate driving circuit 20, and the signal lines 201 can be used to cascade shift registers 21. Since the gate driving circuit 20 is disposed on a side of the plurality of winding portions 30 adjacent to the display area AA in the first sub-area 11, the shift registers 21 in the first sub-area can be electrically connected to the shift registers 21 in other areas via the signal lines 201. There is at least one of the signal lines 201 that its orthographic projection on the substrate 00 intersects with the orthographic projection of one of the first sub-portion 301 and the second sub-portion 302 on the substrate 00. In order to avoid the signal lines 201 and one of the first sub-portion 301 and the third sub-portion 303 being short-circuited, in one embodiment, the signal lines 201 and the first sub-portion 301, or the signal lines 201 and the third sub-portion 303 are set in different film layers.

It should be noted that FIG. 10 is a view obtained by observing the display panel in a direction perpendicular to the substrate 00. Therefore, the orthographic projection of the signal lines 201 on the substrate 00 illustrated in FIG. 10 and the signal lines 201 are coincident. Similarly, the orthographic projection of the first sub-portion 301 on the substrate 00 coincides with the first sub-portion 301, and the orthographic projection of the second sub-portion 302 on the substrate 00 and the second sub-portion 302 are also coincident. The orthographic projections of the various structures in FIG. 10 are not separately labeled.

It should be noted that, in one embodiment, only one signal line 201 is illustrated. The specific number of the signal lines 201 needs to be set according to the actual requirements of the gate driving circuit. The number of the signal lines 201 is not specifically limited according to various embodiments of the present disclosure.

Figure 11:
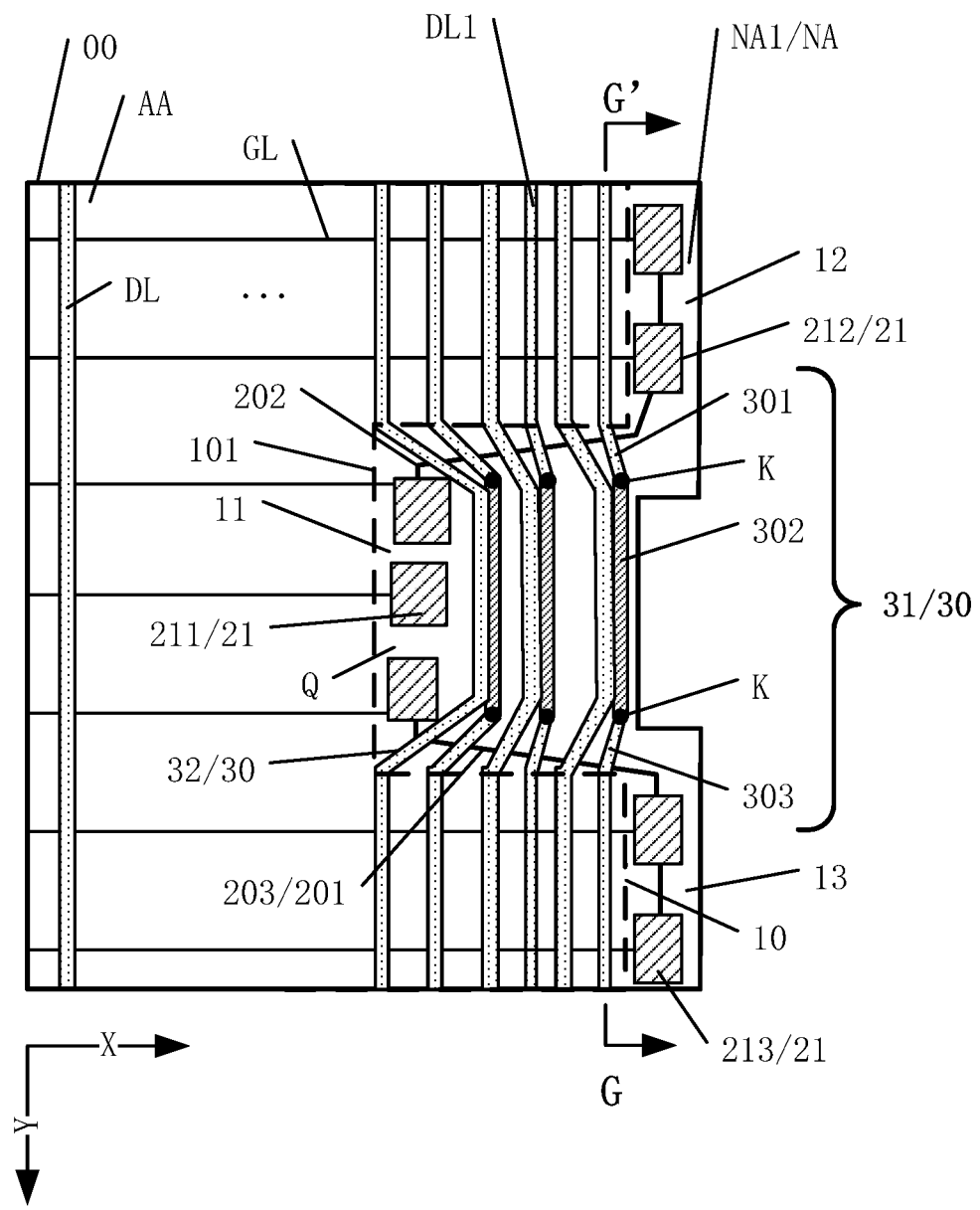
FIG. 11 is a partial schematic top view of another exemplary display panel according to an embodiment of the present disclosure.

In some optional embodiments, referring to FIG. 11, FIG. 11 is a partial top view of a display panel according to an embodiment of the present disclosure. In one embodiment, the first non-display area NA1 further includes a second sub-region 12 and a third sub-region 13, the second sub-region 12 and the third sub-region 13 are located on opposite sides of the first sub-region 11 in the column direction Y.

The gate driving circuit 20 includes a plurality of shift registers 21, and the plurality of shift registers 21 includes a first shift register 211 in the first sub-region 11, a second shift register 212 in the second sub-region 12, and a third shift register 213 in the three sub-regions 13.

The signal lines 201 include at least one first signal line 202 and at least one second signal line 201 one end of the at least one first signal line 202 is electrically connected to the first shift register 211, and an other end of the at least one first signal line 202 is electrically connected to the second shift register 12. One end of the at least one second signal line 203 is electrically connected to the first shift register 211, and an other end of the at least one second signal line 203 is electrically connected to the third shift register 213.

In the display panel provided in one embodiment, the first non-display area NA1 includes three sub-areas, which are a first sub-area 11, a second sub-area 12, and a third sub-area 13. Shift registers 21 are disposed in each of the three sub-areas. Since the first sub-area 11 is located at the notch Q of the display area AA, and the gate driving circuit 20 in the first sub-area 11 is disposed on the side of the plurality of winding portions 30 adjacent to the display area AA, it is set that the first shift register 211 is electrically connected to the second shift register 212 through the at least one first signal line 202, and the first shift register 211 is electrically connected to the third shift register 213 through the at least one second signal line 203.

It should be noted that in one embodiment, it is described as an example with only one for each of the at least one first signal line 202 and the at least one second signal line 203. The specific number of the signal lines 201 needs to be set according to the actual requirements of the gate driving circuit. The embodiment does not specifically limit the number of the signal lines 201.

Figure 12:
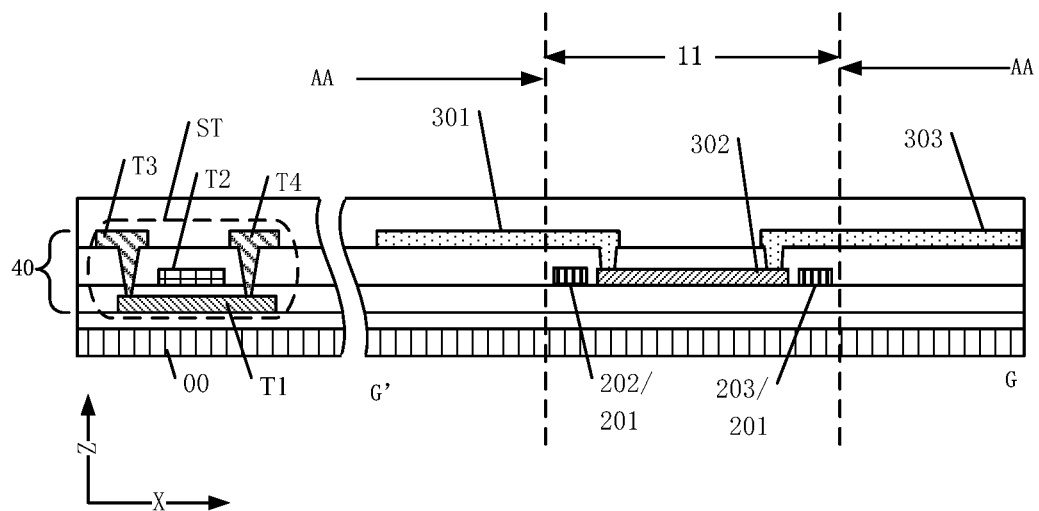
FIG. 12 is a cross-sectional structural view taken along line GG' of FIG. 11.

In some alternative embodiments, referring to FIG. 11 and FIG. 12, FIG. 12 is a schematic cross-sectional view taken along the line GG' in FIG. 11. In one embodiment, the display panel includes a driving device layer 40, the driving device layer 40 includes a plurality of thin film transistors ST, and each of the plurality of thin film transistors ST includes a semiconductor region T1, a gate T2, a source T3 and a drain T4.

The signal lines 201 and the gate T2 are located on a same film layer.

It is to be noted that, in order to clearly illustrate the technical solution of the present embodiment, FIG. 12 is the cross-sectional structure view taken along the line GG' in FIG. 11, and the cross-sectional structure view of the display panel at a thin film transistor ST is also illustrated.

In one embodiment, the signal lines 201 and the gate 12 are both disposed on a first metal layer, and the first sub-portion 301 and the third sub-portion 303 are both disposed on a second metal layer, so that the signal lines 201 and one of the first sub-portion 301 and the third subsection 303 are cross insulated.

The present disclosure also provides a display device including the display panel provided by any of the above embodiments of the present disclosure.

Figure 13:
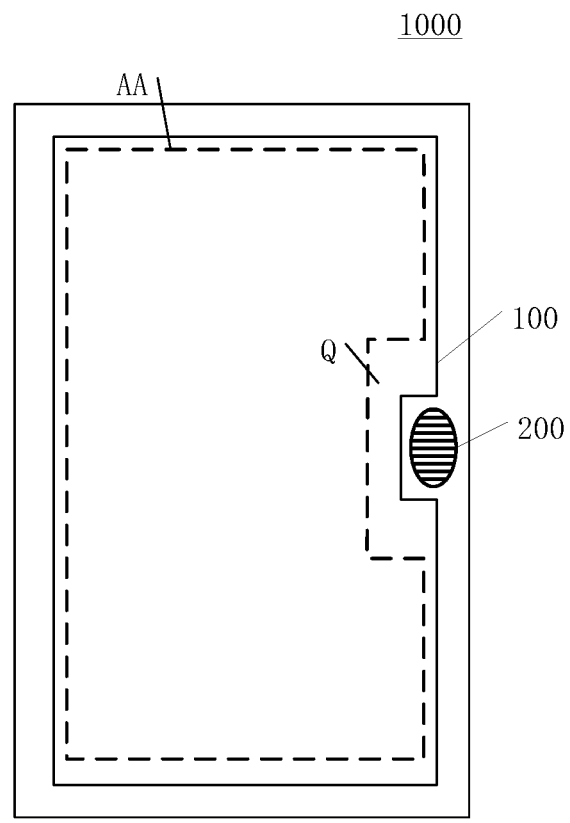
FIG. 13 is a schematic structural view of an exemplary display device according to an embodiment of the present disclosure.

Referring to FIG. 13, FIG. 13 is a schematic structural view of a display device according to an embodiment of the present disclosure. A display device 1000 provided in FIG. 13 includes a display panel 100 provided by any of the above embodiments of the present disclosure. Optionally, the display device further includes an electronic component 200, and the electronic component 200 can be a light sensing component such as a camera or an infrared sensor.

The display device 1000 is described by using a mobile phone as an example in one embodiment illustrated in FIG. 13. It can be understood that the display device provided by one embodiment of the present disclosure may be a display device having a display function, such as a computer, a television, or an in-vehicle display device. The present disclosure does not specifically limit this. The display device provided by one embodiment of the present disclosure has the beneficial effects of the display panel provided by the embodiments of the present disclosure. For details, refer to the detailed description of the display panel in the foregoing embodiments, and details are not described herein again.

It can be seen from the above embodiments that the display panel and the display device provided by the present disclosure achieve at least the following beneficial effects.

The display area includes a plurality of gate lines, a plurality of data lines, and an irregularly-shaped edge. The plurality of gate lines extends in a row direction and the plurality of data lines extends in a column direction. The irregularly-shaped edge includes at least one sub-edge, the at least one sub-edge is recessed toward an inside of the display area to form a notch, and a remaining portion of the irregularly-shaped edge other than the at least one sub-edge extends in the column direction. The non-display area includes a first non-display area adjacent to the irregularly-shaped edge. The first non-display area includes a gate driving circuit electrically connected to the plurality of gate lines. The first non-display area includes a first sub-area adjacent to the at least one sub-edge. The plurality of data lines includes a plurality of irregularly-shaped data lines extending through the first sub-area, and the plurality of irregularly-shaped data lines includes a plurality of winding portions in the first sub-area which is located at a side of the gate driving circuit away from the display area. The plurality of winding portions includes at least one first winding portion, and the at least one first winding portion has at least a wiring portion in a film layer different than a remaining portion of the plurality of winding portions, thereby reducing the spacing between the at least one first winding portion and adjacent winding portions in the row direction. The width of the first sub-area in the row direction can be unconventionally reduced. Also, in order to further prevent the at least one first winding portion and the plurality of gate lines from being short-circuited in the first sub-area, the plurality of winding portions is disposed on the side of the gate driving circuit away from the display area.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the preferred embodiments of the present disclosure, it is understood that it will be appreciated by those skilled in the art that the above embodiments may be modified without departing from the scope and spirit of the present disclosure. The scope of the present disclosure is defined by the appended claims.

What is claimed is:

1. A display panel, comprising:
a display area and a non-display area surrounding the display area, wherein:
the display area comprises a plurality of gate lines, a plurality of data lines, and an irregularly-shaped edge; the plurality of gate lines extends in a row direction, and the plurality of data lines extends in a column direction; and the irregularly-shaped edge comprises at least one sub-edge, the at least one sub-edge is recessed toward an inside of the display area to form a notch, and a remaining portion of the irregularly-shaped edge other than the at least one sub-edge extends in the column direction;
the non-display area comprises a first non-display area adjacent to the irregularly-shaped edge; and the first non-display area comprises a gate driving circuit electrically connected to the plurality of gate lines;
the first non-display area comprises a first sub-area adjacent to the at least one sub-edge;
the plurality of data lines comprises a plurality of irregularly-shaped data lines extending through the first sub-area, and the plurality of irregularly-shaped data lines includes a plurality of winding portions pointing outward away from the display area than a remaining portions of the plurality of irregularly-shaped data lines in the first sub-area which is located at a side of the gate driving circuit away from the display area; and
the plurality of winding portions comprises at least one first winding portion, wherein the at least one first winding portion has at least a wiring portion in a film layer different than a remaining portion of the plurality of winding portions.

2. The display panel according to claim 1, wherein:
the plurality of winding portions comprises at least one second winding portion; and
the remaining portion of the plurality of winding portions is in a same film layer and includes the at least one second winding portion.

3. The display panel according to claim 2, wherein:
the plurality of winding portions comprises a plurality of first winding portions and a plurality of second winding portions, and the plurality of first winding portions and the plurality of second winding portions are alternately disposed in the row direction.

4. The display panel according to claim 2, wherein:
the display panel comprises a driving device layer, the driving device layer includes a plurality of thin film transistors, and each of the plurality of thin film transistors comprises a semiconductor portion, a gate, a source, and a drain; and
the at least one second winding portion, the source, and the drain are located in a same film layer.

5. A display panel, comprising:
a display area and a non-display area surrounding the display area, wherein:
the display area comprises a plurality of gate lines, a plurality of data lines, and an irregularly-shaped edge; the plurality of gate lines extends in a row direction, and the plurality of data lines extends in a column direction; and the irregularly-shaped edge comprises at least one sub-edge, the at least one sub-edge is recessed toward an inside of the display area to form a notch, and a remaining portion of the irregularly-shaped edge other than the at least one sub-edge extends in the column direction;
the non-display area comprises a first non-display area adjacent to the irregularly-shaped edge; and the first non-display area comprises a gate driving circuit electrically connected to the plurality of gate lines;
the first non-display area comprises a first sub-area adjacent to the at least one sub-edge;
the plurality of data lines comprises a plurality of irregularly-shaped data lines extending through the first sub-area, and the plurality of irregularly-shaped data lines includes a plurality of winding portions in the first sub-area which is located at a side of the gate driving circuit away from the display area;
the plurality of winding portions comprises at least one first winding portion, wherein the at least one first winding portion has at least a wiring portion in a film layer different than a remaining portion of the plurality of winding portions;
each of the plurality of winding portions comprises a first sub-portion, a second sub-portion, and a third sub-portion, one end of the second sub-portion is connected to the first sub-portion, and an other end of the second sub-portion is connected to the third sub-portion; and
in the at least one first winding portion, the first sub-portion and the third sub-portion are located in a same film layer, and the second sub-portion and the first sub-portion are located in different film layers.

6. The display panel according to claim 5, wherein:
the display panel comprises a driving device layer, the driving device layer comprises a plurality of thin film transistors, and each of the plurality of thin film transistors comprises a semiconductor portion, a gate, a source, and a drain;
the first sub-portion, the third sub-portion, the source, and the drain are located in a same film layer; and
the second sub-portion and the gate are located in a same film layer.

7. The display panel according to claim 5, wherein:
the gate driving circuit comprises signal lines;
the display panel comprises a substrate, and an orthographic projection of at least one of the signal lines on the substrate intersects an orthographic projection of one of the first sub-portion and the third sub-portion on the substrate; and
the signal lines and the first sub-portion are respectively located in different film layers.

8. The display panel according to claim 7, wherein:
the first non-display area further comprises a second sub-area and a third sub-area, and the second sub-area and the third sub-area are located on opposite sides of the first sub-area in the column direction;
the gate driving circuit comprises a plurality of shift registers, and the plurality of shift registers includes a first shift register in the first sub-area, a second shift register in the second sub-area, and a third shift register in the third sub-area; and
the signal lines comprise at least one first signal line and at least one second signal line; one end of the at least one first signal line is electrically connected to the first shift register, and an other end of the at least one first signal line is electrically connected to the second shift register; one end of the at least one second signal line is electrically connected to the first shift register, and an other end of the at least one second signal line is electrically connected to the third shift register.

9. The display panel according to claim 7, wherein:
the display panel comprises a driving device layer, the driving device layer includes a plurality of thin film transistors, and each of the plurality of thin film transistors comprises a semiconductor portion, a gate, a source, and a drain; and
the signal lines and the gate are located in a same film layer.

10. The display panel according to claim 5, wherein:
the plurality of winding portions comprises at least one second winding portion; and
the remaining portion of the plurality of winding portions is in a same film layer and includes the at least one second winding portion.

11. The display panel according to claim 10, wherein:
the plurality of winding portions comprises a plurality of first winding portions and a plurality of second winding portions, and the plurality of first winding portions and the plurality of second winding portions are alternately disposed in the row direction.

12. A display device comprising:
a display panel, comprising:
a display area and a non-display area surrounding the display area, wherein:
the display area comprises a plurality of gate lines, a plurality of data lines, and an irregularly-shaped edge; the plurality of gate lines extends in a row direction, and the plurality of data lines extends in a column direction; and the irregularly-shaped edge comprises at least one sub-edge, the at least one sub-edge is recessed toward an inside of the display area to form a notch, and a remaining portion of the irregularly-shaped edge other than the at least one sub-edge extends in the column direction;
the non-display area comprises a first non-display area adjacent to the irregularly-shaped edge; and the first non-display area comprises a gate driving circuit electrically connected to the plurality of gate lines;
the first non-display area comprises a first sub-area adjacent to the at least one sub-edge;
the plurality of data lines comprises a plurality of irregularly-shaped data lines extending through the first sub-area; and the plurality of irregularly-shaped data lines includes a plurality of winding portions pointing outward away from the display area than a remaining portions of the plurality of irregularly-shaped data lines in the first sub-area which is located at a side of the gate driving circuit away from the display area; and
the plurality of winding portions comprises at least one first winding portion, wherein the at least one first winding portion has at least a wiring portion in a film layer different than a remaining portion of the plurality of winding portions.

13. The display device according to claim 12, wherein:
the plurality of winding portions comprises at least one second winding portion; and
the remaining portion of the plurality of winding portions is in a same film layer and includes the at least one second winding portion.

14. The display device according to claim 13, wherein:
the plurality of winding portions comprises a plurality of first winding portions and a plurality of second winding portions, and the plurality of first winding portions and the plurality of second winding portions are alternately disposed in the row direction.

15. The display device according to claim 13, wherein:
the display panel comprises a driving device layer, the driving device layer includes a plurality of thin film transistors, and each of the plurality of thin film transistors comprises a semiconductor portion, a gate, a source, and a drain; and
the at least one second winding portion, the source, and the drain are located in a same film layer.

16. The display device according to claim 12, wherein:
each of the plurality of winding portions comprises a first sub-portion, a second sub-portion, and a third sub-portion, one end of the second sub-portion is connected to the first sub-portion, and an other end of the second sub-portion is connected to the third sub-portion; and
in the at least one first winding portion, the first sub-portion and the third sub-portion are located in a same film layer, and the second sub-portion and the first sub-portion are located in different film layers.

17. The display device according to claim 16, wherein:
the display panel comprises a driving device layer, the driving device layer comprises a plurality of thin film transistors, and each of the plurality of thin film transistors comprises a semiconductor portion, a gate, a source, and a drain;
the first sub-portion, the third sub-portion, the source, and the drain are located in a same film layer; and
the second sub-portion and the gate are located in a same film layer.

18. The display device according to claim 16, wherein:
the gate driving circuit comprises signal lines;
the display panel comprises a substrate, and an orthographic projection of at least one of the signal lines on the substrate intersects an orthographic projection of one of the first sub-portion and the third sub-portion on the substrate; and
the signal lines and the first sub-portion are respectively located in different film layers.

19. The display device according to claim 18, wherein:
the first non-display area further comprises a second sub-area and a third sub-area, and the second sub-area and the third sub-area are located on opposite sides of the first sub-area in the column direction;
the gate driving circuit comprises a plurality of shift registers, and the plurality of shift registers includes a first shift register in the first sub-area, a second shift register in the second sub-area, and a third shift register in the third sub-area; and
the signal lines comprise at least one first signal line and at least one second signal line; one end of the at least one first signal line is electrically connected to the first shift register, and an other end of the at least one first signal line is electrically connected to the second shift register; one end of the at least one second signal line is electrically connected to the first shift register, and an other end of the at least one second signal line is electrically connected to the third shift register.

20. The display device according to claim 18, wherein:
the display panel comprises a driving device layer, the driving device layer includes a plurality of thin film transistors, and each of the plurality of thin film transistors comprises a semiconductor portion, a gate, a source, and a drain; and the signal lines and the gate are located in a same film layer.

* * * * *